(12) United States Patent
Kim et al.

(10) Patent No.: US 7,713,879 B2
(45) Date of Patent: May 11, 2010

(54) CHEMICAL MECHANICAL POLISHING METHOD

(75) Inventors: Dong-Keun Kim, Gyeonggi-do (KR); Chung-Ki Min, Gyeonggi-do (KR); Yong-Sun Ko, Gyeonggi-do (KR); Kyung-Hyun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 766 days.

(21) Appl. No.: 11/321,848

(22) Filed: Dec. 28, 2005

(65) Prior Publication Data

US 2006/0141790 A1   Jun. 29, 2006

(30) Foreign Application Priority Data

Dec. 28, 2004   (KR) ...................... 10-2004-0113752

(51) Int. Cl.
  *H01L 21/302*   (2006.01)
(52) U.S. Cl. .................. 438/692; 216/89; 451/287; 252/79.1
(58) Field of Classification Search ................ 438/690, 438/691, 692, 693, 694; 216/89; 451/287, 451/288; 252/79.1–79.5
  See application file for complete search history.

(56) References Cited

U.S. PATENT DOCUMENTS

| | | | |
|---|---|---|---|
| 5,858,813 A * | 1/1999 | Scherber et al. ............ | 438/693 |
| 6,368,955 B1 * | 4/2002 | Easter et al. ................ | 438/633 |
| 6,429,134 B1 * | 8/2002 | Kubota et al. ............... | 438/692 |
| 6,435,942 B1 | 8/2002 | Jin et al. | |
| 6,593,240 B1 * | 7/2003 | Page ........................... | 438/692 |
| 6,723,652 B1 * | 4/2004 | Fukuda ....................... | 438/714 |
| 6,828,240 B2 * | 12/2004 | Hellig et al. ................ | 438/700 |
| 2001/0055941 A1 * | 12/2001 | Koos et al. ..................... | 451/57 |
| 2002/0130049 A1 * | 9/2002 | Chen et al. .................. | 205/640 |
| 2004/0142640 A1 * | 7/2004 | Prabhu et al. ................. | 451/41 |
| 2005/0148184 A1 * | 7/2005 | Hsu et al. .................... | 438/692 |

FOREIGN PATENT DOCUMENTS

| | | |
|---|---|---|
| JP | 7142432 | 6/1995 |
| JP | 11-087287 | 3/1999 |
| KR | 20000032544 | 6/2000 |
| KR | 2001-0061124 | 7/2001 |
| KR | 20010108048 | 12/2001 |
| KR | 20040000139 | 1/2004 |

* cited by examiner

*Primary Examiner*—Nadine G. Norton
(74) *Attorney, Agent, or Firm*—Mills & Onello, LLP

(57) ABSTRACT

In an embodiment, a chemical mechanical polishing method for a substrate having a first layer and a stepped portion. A surface of the first layer is positioned above an upper face of the stepped portion. A polishing process for selectively removing the stepped portion is performed on the first layer by using a first slurry composition that has a self-stopping characteristic so that the first layer is changed into a second layer having a substantially flat surface. A second polishing process is performed using a second slurry composition that does not have the self-stopping characteristic, until the upper face of the stepped portion is exposed.

24 Claims, 10 Drawing Sheets

CHEMICAL MECHANICAL POLISHING METHOD

CROSS REFERENCE TO RELATED APPLICATION

This application claims benefit of priority under 35 USC §119 from Korean Patent Application No. 2004-113752 filed on Dec. 28, 2004, the disclosure of which is incorporated herein by reference in its entirety.

BACKGROUND OF THE INVENTION

1. Field of the Invention

The present invention relates to a chemical mechanical polishing method. More particularly, the present invention relates to a chemical mechanical polishing method for polishing a silicon oxide layer.

2. Description of the Related Art

A multi-layer wiring structure may be employed in a semiconductor device if the semiconductor device is required to have a high capacity and a high degree of integration. The multi-layer wiring structure is generally formed by repeatedly performing processes for forming and patterning a conductive layer and an insulation layer. After the conductive layer and the insulation layer are etched to form a conductive layer pattern and an insulation layer pattern, planarization processes are carried out. Owing to the planarization processes, successive photolithography for forming the conductive layer pattern and the insulation layer pattern may be efficiently performed. The planarization processes may be typically divided into a local planarization process and a global planarization process. However, the ultimate goal of the planarization processes is to achieve the global planarization.

An etch-back process, a reflow process, and a chemical mechanical polishing process have been developed as planarization processes. The chemical mechanical polishing process is largely employed for forming a highly integrated circuit because the chemical mechanical polishing process efficiently achieves the global planarization of a layer to be polished. This is also because the chemical mechanical polishing process may efficiently achieve a relatively high planarity.

The chemical mechanical polishing process is developed by International Business Machines (IBM) Corp. in the late 1980s. In the chemical mechanical polishing process, a semiconductor substrate is disposed beneath a polishing head of a chemical mechanical polishing apparatus. A polishing pad is positioned under the semiconductor substrate. A slurry composition including deionized water, an abrasive and an additive is provided onto the semiconductor substrate. The semiconductor substrate and the polishing pad may be moved with respect to each other while the polishing pad makes contact with the semiconductor substrate. Thus, a surface portion of the semiconductor substrate may be planarized. The abrasive of the slurry composition and protrusions of the polishing pad may mechanically polish the surface portion of the semiconductor substrate. Simultaneously, the surface portion of the semiconductor substrate is chemically polished by reactions between chemical components included in the slurry composition and ingredients in the surface portion of the semiconductor substrate.

A polishing efficiency of the chemical mechanical polishing process may be determined by the chemical mechanical polishing apparatus, the slurry composition, and the type of the polishing pad. In particular, the efficiency of the chemical mechanical polishing process may be increased by selectively using at least two slurry compositions. For example, a conventional method selectively using at least two slurry compositions is disclosed in Korean Patent Laid-Open Publication No. 2001-0061124.

In addition, a high-planarity slurry chemical mechanical polishing (HPS-CMP) process using a high-planarity slurry composition capable of improving planarity has been developed.

The HPS-CMP process is characterized by a layer having a stepped portion that is passivated by polymers to reduce a chemical polishing rate of the layer. Thus, the layer may be mechanically polished from the stepped portion rather than chemically. When the stepped portion is removed, an area of the layer, the area contacting a polishing pad of a chemical mechanical polishing apparatus employed for performing the HPS-CMP process, may become wide. That is, the flat surface area increases. In addition, the area may also be passivated by the polymers. Because the layer is not chemically polished because of the polymers attached to the layer, the area of the layer may be substantially dense. Thus, the layer may hardly be polished either chemically or mechanically after the stepped portion is removed. That is, the HPS-CMP process may stop by itself after the stepped portion is removed. In other words, a self-stopping characteristic may appear. As a result, a substantially high planarity may be easily achieved by employing the HPS-CMP process.

However, although the HPS-CMP process is employed, if a substrate formed under the layer has a protrusion having an upper face, then the protrusion of the substrate may be partially removed in removing the stepped portion of the layer.

FIG. 1 is a cross-sectional view illustrating a substrate and a silicon oxide layer formed on the substrate before a conventional HPS-CMP process is performed on the silicon oxide layer. FIG. 2 is a cross-sectional view illustrating the substrate and the silicon oxide layer after the conventional HPS-CMP process is performed on the silicon oxide layer.

Referring to FIG. 1, a substrate 100 includes a first stepped portion 110 and a second stepped portion 120 connected to the first stepped portion 110. The first stepped portion 110 includes at least two patterns adjacent to each other. In addition, the first stepped portion 110 includes a first upper face 110a, a first lower face 110b positioned below the first upper face 110a and a first sidewall 110c between the first upper face 110a and the first lower face 110b.

The first upper face 110a and the first lower face 110b may be substantially horizontal. In addition, the first upper face 110a may be substantially parallel with the first lower face 110b. The first sidewall 110c may be substantially vertical. In addition, the first sidewall 110c may be substantially perpendicular to the first upper face 110a and the first lower face 110b.

The second stepped portion 120 may include a second upper face 120a, a second lower face 120b positioned below the second upper face 120a and a second sidewall 120c between the second upper face 120a and the second lower face 120b.

The first lower face 110b of the first stepped portion 110 and the second upper face 120a of the second stepped portion 120 may be substantially coplanar. That is, the first lower face 110b may correspond to the second upper face 120a. Thus, the first stepped portion 110 may be to the second stepped portion 120.

A layer 200 is formed on the substrate 100 to cover the first and second stepped portions 110 and 120. The layer 200 has a third stepped portion positioned over the first upper face 110a of the first stepped portion 110. The third stepped portion may conform to the first stepped portion 110.

A portion 201 of a surface of the layer 200, the portion 201 being positioned directly over the lower face 120b of the second stepped portion 120, is positioned below a polishing target face 300 corresponding to the upper face 110a of the first stepped portion 110.

Referring to FIG. 2, the conventional HPS-CMP process using the high-planarity slurry composition is performed on the layer 200. Thus, the layer 200 is polished to the polishing target face 300. As illustrated in FIG. 2, the first and second stepped portions 110 and 120 of the substrate 100 are partially removed.

In performing the HPS-CMP process, a polishing pad positioned directly over the lower face 120b of the second stepped portion 120 may be positioned lower than the polishing pad positioned directly over the upper face 110a of the first stepped portion 110. Thus, although the first stepped portion 110 is removed, the HPS-CMP process may not stop by itself. That is, the self-stopping characteristic may not appear. Furthermore, corners of the first and second stepped portions 110 and 120 may be excessively polished because of an orbital movement of the polishing pad. Thus, the first and second stepped portions 110 and 120 may be unfortunately damaged.

As a result, a chemical mechanical polishing method capable of achieving a substantially high planarity as well as fully protecting a structure covered with a layer that is to be polished is an important topic of research.

SUMMARY OF THE INVENTION

Some embodiments of the present invention provide a chemical mechanical polishing method capable of achieving a substantially high planarity as well as fully protecting a structure covered with a layer that is to be polished.

In accordance with some embodiments of the present invention, there is provided a chemical mechanical polishing method for polishing a substrate. The substrate, for example, includes a first stepped portion having a first upper face, a first lower face positioned below the first upper face and a first sidewall connected between the first upper face and the first lower face. A first layer is formed on the substrate. The first layer includes a second stepped portion. The second stepped portion has a second upper face, a second lower face positioned below the second upper face and a second sidewall connected between the second upper face and the second lower face. The second stepped portion is formed over the first stepped portion so that the second stepped portion may substantially conform to the first stepped portion. The first upper face of the first stepped portion is positioned below the second lower face of the second stepped portion.

In this method, a first polishing process is performed on the second stepped portion to change the first layer into a second layer having a substantially flat surface. The second layer covers the first upper face. A second polishing process is performed on the second layer until the first upper face is exposed.

The first layer may include an oxide.

The first polishing process may be performed using a first slurry composition that has a self-stopping characteristic. Particularly, the first slurry composition may include a surfactant having an anionic polymer and have a pH value at which a zeta potential of the first layer is positive. Alternatively, the first slurry composition may include a surfactant having an anionic polymer and have a pH value at which a zeta potential of the first layer is negative.

The second polishing process may be performed using a second slurry composition that does not have the self-stopping characteristic. Particularly, the second slurry composition may include a surfactant including an anionic polymer and have a pH value at which a zeta potential of the second layer is negative.

Alternatively, the second slurry composition may include an abrasive, DI water, and a pH control agent.

In accordance with some embodiments of the present invention, there is provided a method of chemical mechanical polishing a substrate. The substrate, for example, includes a first stepped portion having an upper face and a first layer on the substrate. The first layer includes a second stepped portion formed over the first stepped portion. In addition, the second stepped portion substantially conforms to the first stepped portion.

In the method, a first polishing process is performed on the second stepped portion to change the first layer into a second layer having a substantially flat surface. The second layer covers the upper face. A second polishing process is then performed on the second layer until the upper face is exposed.

BRIEF DESCRIPTION OF THE DRAWINGS

The above and other advantages of the present invention will become readily apparent by reference to the following detailed description when considered in conjunction with the accompanying drawings in which.

DESCRIPTION OF THE EMBODIMENTS

Figure 1:
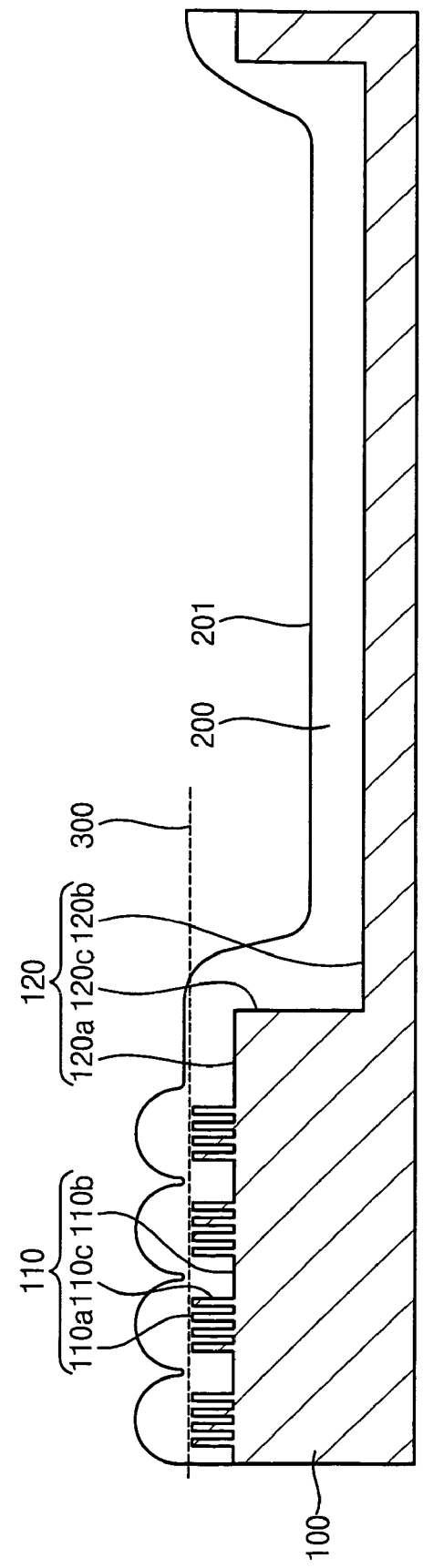
FIGS. 1 and 2 are cross-sectional views illustrating problems of a conventional chemical mechanical polishing process.
Figure 2:
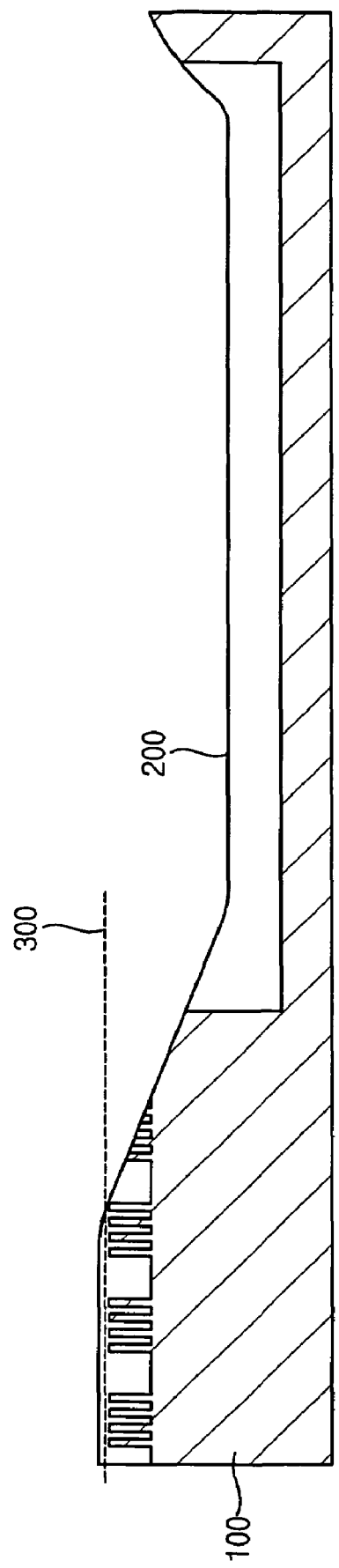

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the sizes and relative sizes of layers and regions may be exaggerated for clarity. The drawings are not to scale. Like reference numerals refer to like elements throughout.

It will be understood that when an element or layer is referred to as being "on", "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature of a device and are not intended to limit the scope of the present invention.

Chemical Mechanical Polishing Method 1

Figure 3:
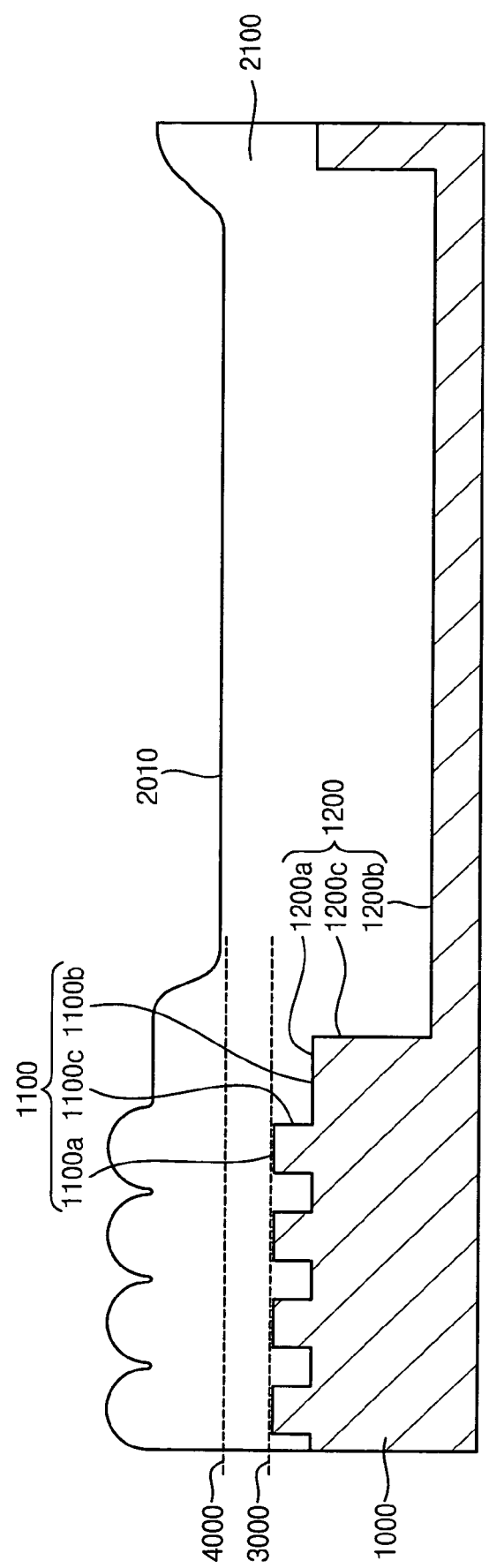
FIGS. 3 to 5 are cross-sectional views illustrating a chemical mechanical polishing method in accordance with embodiments of the present invention.
Figure 4:
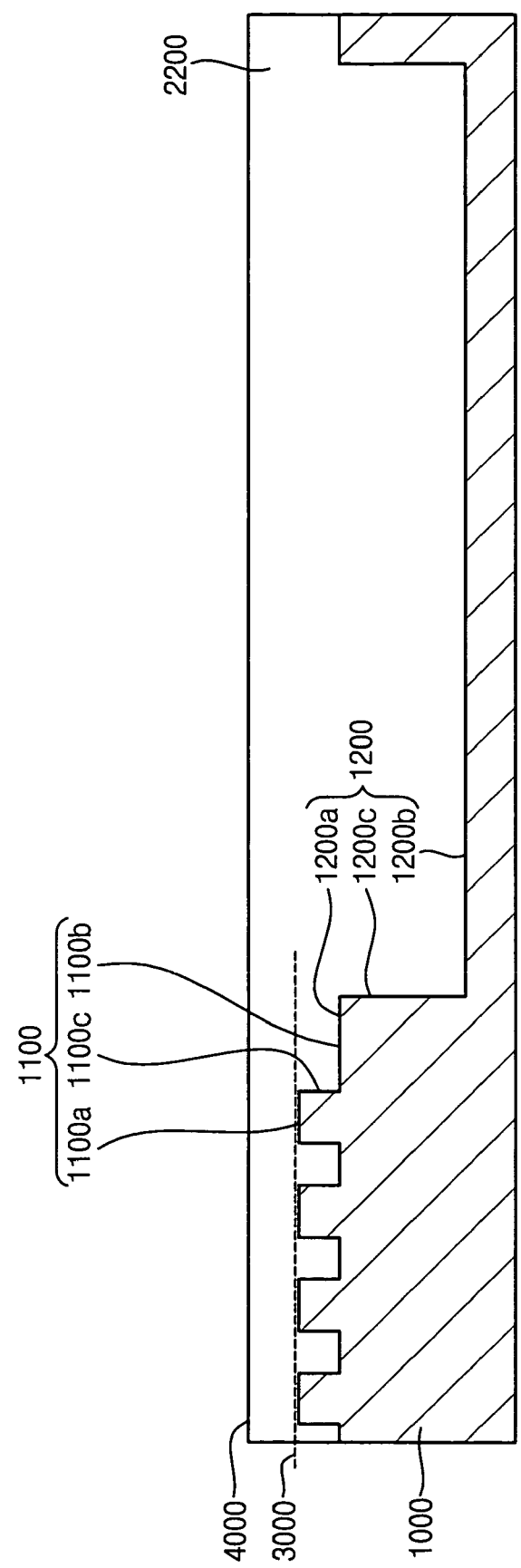
Figure 5:
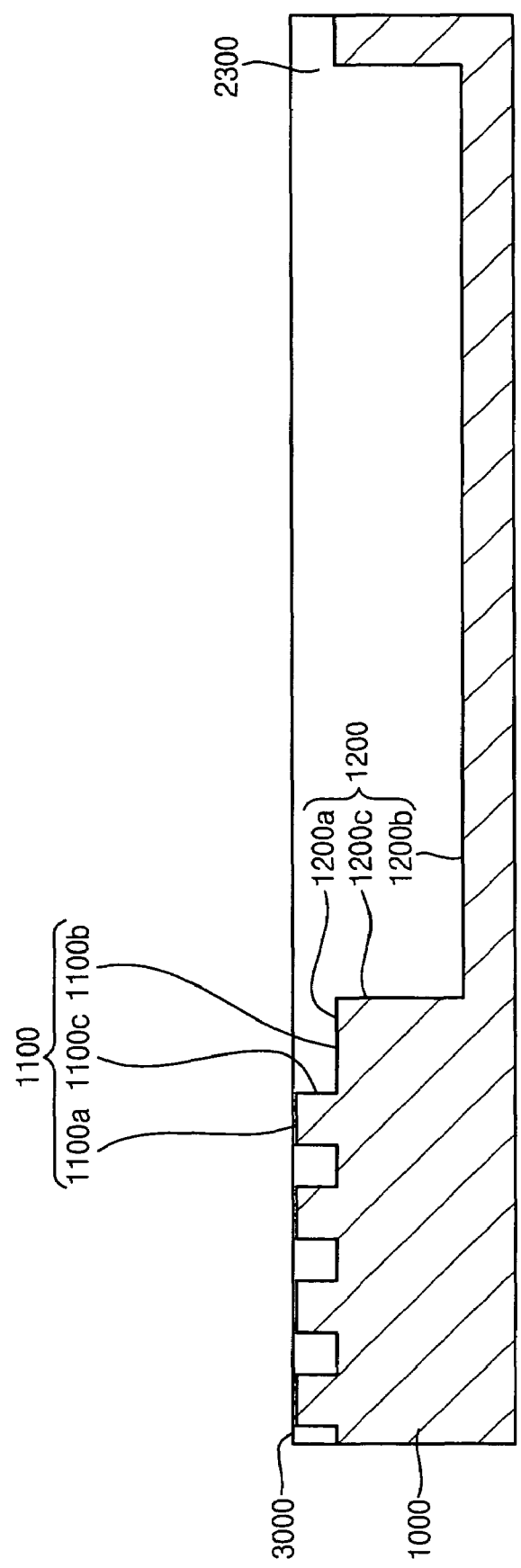

FIGS. 3 to 5 are cross-sectional views illustrating a first chemical mechanical polishing method in accordance with embodiments of the present invention.

Referring to FIG. 3, a substrate 1000 includes a first stepped portion 1100 and a second stepped portion 1200. The second stepped portion 1200 is connected to the first stepped portion 1100.

In detail, the first stepped portion 1100 includes a first upper face 1100a, a first lower face 1100b positioned below the first upper face 1100a, and a first sidewall 1100c between the first upper face 1100a and the first lower face 1100b. The first upper face 1100a and the first lower face 1100b may be substantially horizontal. In addition, the first upper face 1100a may be substantially parallel with the first lower face 1100b. The first sidewall 1100c may be substantially vertical. In addition, the first sidewall 1100c may be substantially perpendicular to the first upper face 1100a and the first lower face 1100b.

The second stepped portion 1200 may include a second upper face 1200a, a second lower face 1200b positioned below the second upper face 1200a and a second sidewall 1200c between the second upper face 1200a and the second lower face 1200b.

The first lower face 1100b of the first stepped portion 1100 and the second upper face 1200a of the second stepped portion 1200 may be substantially coplanar. That is, the first lower face 1100b may correspond to the second upper face 1200a. Thus, the first stepped portion 1100 may be connected to the second stepped portion 1200.

A first layer 2100 is formed on the substrate 1000. The first layer 2100 may include an oxide such as a silicon oxide. The first layer 2100 may be formed by a plasma-enhanced chemical vapor deposition (PE-CVD) process or a high-density plasma chemical vapor deposition (HDP-CVD) process. The silicon oxide may include boro-phosphor silicate glass (BPSG), phosphor silicate glass (PSG), undoped silicate glass (USG), or spin on glass (SOG). These may be used alone or in combination. In some embodiments, the silicon oxide may be PE-CVD oxide formed by the PE-CVD process.

Stepped portions are formed at an upper portion of the first layer 2100. Shapes of the stepped portions may correspond to shapes of the first stepped portion 1100 and the second stepped portion 1200.

A polishing target face 3000 is set up over the lower face 1100b of the first stepped portion 1100. The polishing target face 3000 and the upper face 1100a of the first stepped portion 1100 may be substantially coplanar.

The first layer 2100 may have an upper face positioned over the polishing target face 3000. In detail, a height of a portion of the first layer 2100, the portion positioned on the lower face 1200b of the second stepped portion 1200, may be substantially larger than that of the polishing target face 3000.

Referring to FIG. 4, the stepped portions formed at the upper portion of the first layer 2100 are removed by using a first slurry composition to form a second layer 2200 having an upper face that is relatively flat. The upper face corresponds to a preliminary polishing target face 4000. That is, the first layer 2100 is planarized by using the first slurry composition until the preliminary polishing target face 4000 is exposed. Thus, the second layer 2200 may be formed.

The first slurry composition may include an abrasive, deionized (DI) water, a surfactant, an amine compound and a pH control agent.

If the first slurry composition includes less than about 0.5 percent by weight of the abrasive, a mechanical polishing rate of the first layer 2100 may be unfortunately low. On the other hand, if the first slurry composition includes over about 2.0 percent by weight of the abrasive, scratches may be unfortunately generated on a surface of the second layer 2200. Thus, the first slurry composition may preferably include about 0.5 to about 2 percent by weight of the abrasive. For example, the first slurry composition more preferably includes about 0.75 to about 1.5 percent by weight of the abrasive. The abrasive may include silica, ceria, alumina, titania, zirconia or germania. These may be used alone or in combination. In some preferred embodiments, the abrasive may include ceria. When the first slurry composition includes below about 94.6 percent by weight of DI water, the viscosity of the first slurry composition may increase so that a chemical mechanical polishing apparatus may be unfortunately damaged while performing a chemical mechanical polishing process on the first layer 2100. On the other hand, when the first slurry composition includes over about 98 percent by weight of the DI water, the viscosity of the slurry composition may decrease so that the mechanical polishing rate of the first layer 2100 may unfortunately decrease. Thus, the first slurry composition may preferably include about 94.6 to about 98 percent by weight of the DI water. For example, the first slurry composition more preferably includes about 95 to about 97 percent by weight of the DI water.

Examples of the surfactant that may be used in the present invention may include polycarboxylic acid, polyethylenimine, polyvinyl sulfonic acid, polyvinyl sulfonic acid salt, polyethylenimine salt, polyvinyl sulfonic acid salt, or ammonium polycarboxylate. These may be used alone or in combination. In some preferred embodiments, the surfactant includes ammonium polycarboxylate.

The surfactant may dissociate into an anionic polymer and a cation with the aid of the DI water included in the first slurry composition. A first chemical equation relating to a dissociation of the surfactant is as follows.

[Chemical Equation 1]

A surface charge of a layer in a solution may be represented by using a zeta potential (mV). When the zeta potential is positive, the surface of the layer may have a positive charge. When the zeta potential is negative, the surface of the layer may have a negative charge. A pH value of the solution at which the zeta potential is substantially zero is referred to as an isoelectric point.

Figure 6:
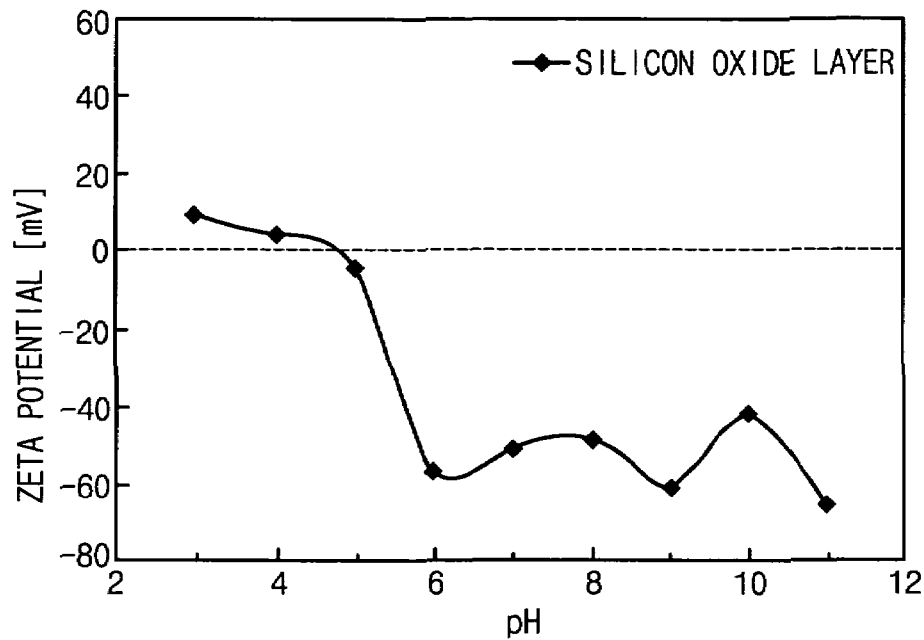
FIG. 6 is a graph illustrating a zeta potential of a silicon oxide layer with respect to a pH value of a slurry composition.

FIG. 6 is a graph illustrating a zeta potential of a silicon oxide layer with respect to a pH value of a slurry composition.

Referring to FIG. 6, the isoelectric point of a silicon oxide layer is about pH 5. When a pH value of the slurry composition is substantially lower than about pH 5, the zeta potential may be positive. Thus, the surface of the silicon oxide layer may have a positive charge.

Accordingly, anionic polymers dissociated from the surfactant may be attached to the surface of the silicon oxide layer by an electrostatic attractive force. Thus, the anionic polymers may chemically protect the surface of the silicon oxide layer.

Because the anionic polymers chemically protect the surface of the silicon oxide layer, the stepped portions formed at the upper portion of the silicon oxide layer may be mechanically polished with the aid of the polishing pad and the abrasive rather than chemically.

After the stepped portions are removed, an upper face of the silicon oxide layer may be relatively flat. Thus, an area of the silicon oxide layer, the area contacting the polishing pad, may become relatively wide. In addition, since the upper face of the silicon oxide layer is chemically protected by the polymers attached thereto, the upper face of the silicon oxide layer may act physically dense. As a result, after the stepped portions are removed, a mechanical polishing rate rapidly shrinks so that the silicon oxide layer may be hardly polished. That is, a polishing process of the silicon oxide layer may stop by itself. In other words, a self-stopping characteristic appears.

When the first slurry composition includes less than about 0.01 percent by weight of the surfactant, the amount of the anionic polymer dissociated from the surfactant is relatively small. Thus, unfortunately, the silicon oxide layer may not be fully protected by the anionic polymer. When the first slurry composition includes over about 3 percent by weight of the surfactant, the anionic polymer may be excessively dissociated from the surfactant. Thus, unfortunately, the anionic polymer may excessively cover the silicon oxide layer so that the stepped portions may not be easily removed. As a result, the first slurry composition may preferably include about 0.01 to about 3 percent by weight of the surfactant.

When the first slurry includes about 1.6 to about 3 percent by weight of the surfactant, the anionic polymer dissociated from the surfactant may efficiently protect the silicon oxide layer. In addition, the anionic polymer floats between the polishing pad and the silicon oxide layer so that the anionic polymer may prevent the abrasive from mechanically polishing the silicon oxide layer. Furthermore, the anionic polymer affects fluidity of the first slurry composition. As a result, the silicon oxide layer may be efficiently protected.

When a pH value of the first slurry composition is below about 2, the first slurry may be a relatively strong acid. Thus, a chemical mechanical polishing apparatus may be unfortunately damaged. When the pH value of the first slurry composition is over about 5, the silicon oxide layer may unfortunately have a negative zeta potential. Thus, the pH value of the first slurry composition is preferably about 2 to about 5. For example, the pH value of the first slurry composition is more preferably about 3 to 5.

The pH value of the first slurry composition varies with the amount of the pH control agent included in the first slurry composition. The pH control agent may be potassium hydroxide (KOH), sodium hydroxide (NaOH), ammonium hydroxide ($NH_4OH$), sulfuric acid ($H_2SO_4$), hydrochloric acid (HCl), or nitric acid ($HNO_3$). These may be used alone or in combination. In some embodiments, potassium hydroxide is used as the pH control agent.

When the pH control agent is below about 0.001 percent by weight, it is disadvantageous in that the pH value of the first slurry composition may not be easily controlled. When the pH control agent is over about 2 percent by weight, the pH control agent may unfortunately serve as an impurity, reducing a polishing rate of the silicon oxide layer. Thus, the pH control agent may preferably be about 0.001 to 2 percent by weight. For example, the pH control agent may more preferably be about 0.001 to 1.1 percent by weight.

Examples of the amine compound that may be used for the first slurry composition may be quaternary amine, quaternary amine salt, or a quaternary amine derivative. These may be used alone or in combination. Examples of the quaternary amine may include tetramethylammonium hydroxide (($CH_3$)$_4$NOH) or choline (($CH_3$)$_3$($CH_2CH_2OH$)NOH). These may be used alone or in combination. Examples of the choline salt or the choline derivative may include choline fluoride, choline chloride, choline bromide, choline iodide, choline dihydrogen citrate, choline bitartrate, choline bicarbonate, choline citrate, choline ascorbate, choline borate, choline theophyllinate, choline gluconate, acetyline chloride, acetylcholine bromide, or metacholine chloride. These may be used alone or in combination.

The amine compound may chemically polish the silicon oxide layer. In addition, the amine compound may promote a dissociation of the surfactant. A second chemical equation illustrates how the amine compound promotes the dissociation of the surfactant. The second chemical equation is as follows.

[Chemical Equation 2]

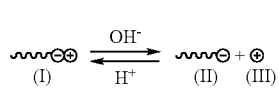

Because the surfactant I in the first slurry is dissolved into the anionic polymer II and a cation III in concentration equilibrium, the surfactant I may be dissolved by a predetermined amount. However, when the amine compound is added to the first slurry composition, an ionization degree of the surfactant I increases. Thus, the amount of the anionic polymer II dissolved from the surfactant I may increase.

When the first slurry composition includes below about 0.05 percent by weight of the amine compound, the amount of the anionic polymer dissociated from the surfactant is relatively small. Thus, unfortunately, the silicon oxide layer may not be fully protected by the anionic polymer. When the first slurry composition includes over about 0.6 percent by weight of the amine compound, the anionic polymer may be excessively dissociated from the surfactant. Thus, unfortunately, the anionic polymer may excessively cover the silicon oxide layer so that the stepped portions may not be easily removed. As a result, the first slurry composition may preferably include about 0.05 to about 0.6 percent by weight of the amine compound. For example, the first slurry composition may more preferably include about 0.4 to about 0.6 percent by weight of the amine compound.

The stepped portions formed at the upper portion of the first layer 2100 are removed using the first slurry composition to form the second layer 2200 having the upper face that is relatively flat. Because the upper face of the second layer 2200 is relatively flat, a polishing rate of the second layer 2200 may be excessively low. Thus, the second layer 2200 may be hardly polished. That is, a polishing process of the second layer 2200 may stop by itself. In other words, a self-stopping characteristic appears. Here, the upper face of the second layer 2200 corresponds to a preliminary polishing target face 4000. In detail, the preliminary polishing target face 4000 may be positioned between the polishing target face 3000 and an initial upper face of the first layer 2100, the initial face being measured before the stepped portions are removed. In addition, a difference in height between the preliminary polishing target face 4000 and the polishing target face 3000 may be from about 3,000 Å to about 5,500 Å.

Referring to FIG. 5, the second layer 2200 is polished from the preliminary polishing target face 4000 to the polishing target face 3000 by using a third slurry composition so that a third layer 2300 may be formed.

The third slurry composition is substantially identical to the first slurry composition except for a pH value and the amount of the surfactant used. Thus, any repetitive explanation will be omitted.

The pH value of the third slurry composition is about 5 to about 12. The amount of the surfactant of the third slurry composition is about 0.001 percent by weight to about 2 percent by weight.

Referring again to FIG. 6, the pH value of the third slurry composition is substantially higher than the isoelectric point of the silicon oxide layer. In other words, the pH value of the third slurry composition is substantially higher than about 5. Thus, the zeta potential may be negative. As a result, the surface of the silicon oxide layer may have a negative charge in the third slurry composition. Because the surface of the silicon oxide layer has the negative charge, an electrical repulsive force may be generated between the surface of the silicon oxide layer and the anionic polymer dissociated from the surfactant. Thus, the anionic polymer may hardly protect the surface of the silicon oxide layer because of the repulsive force. Accordingly, the self-stopping characteristic may not appear.

However, when the third slurry composition includes about 2 to about 3 percent by weight of the surfactant, the self-stopping characteristic may unfortunately appear. It is because the anionic polymer dissociated from the surfactant floats between the polishing pad and the silicon oxide layer and affects fluidity of the third slurry composition. In other words, the silicon oxide layer may be protected by the anionic polymer although the electric repulsive force prevents the anionic polymer from being attached to the silicon oxide layer. Thus, the third slurry composition may preferably include about 0.001 to about 2 percent by weight.

Because the self-stopping characteristic may not appear when the silicon oxide layer is polished using the third slurry composition, a portion of the second layer 2200, the portion being positioned between the preliminary polishing target face 4000 and the polishing target face 3000, is efficiently polished to form the third layer 2300.

Because the third slurry composition is substantially identical to the first slurry composition except for the pH value and the amount of the surfactant used, a chemical mechanical polishing process sequentially using the first slurry composition and the third slurry composition may be efficiently performed in-situ only by regulating the amount of the pH control agent and the amount of the surfactant.

Chemical Mechanical Polishing Method 2

A second chemical mechanical polishing method is substantially the same as the first chemical mechanical polishing method except that a fourth slurry composition is used instead of the third slurry composition. Thus, any repetitive explanation will be omitted.

The fourth slurry composition includes an abrasive, DI water, and a pH control agent.

When the fourth slurry composition includes less than about 3 percent by weight of the abrasive, a mechanical polishing rate may be unfortunately low. When the fourth slurry composition includes over about 28 percent by weight of the abrasive, scratches may be unfortunately generated. Thus, the fourth slurry composition may preferably include about 3 to about 28 percent by weight of the abrasive. For example, the fourth slurry composition more preferably includes about 11 to about 13.5 percent by weight of the abrasive. The abrasive may include silica, ceria, alumina, titania, zirconia, or germania. These may be used alone or in combination. In some preferred embodiments, the abrasive includes silica.

When the fourth slurry composition includes below about 70 percent by weight of the DI water, a viscosity of the fourth slurry composition may increase so that a chemical mechanical polishing apparatus may be unfortunately damaged in a chemical mechanical polishing process. When the first slurry composition includes over about 95 percent by weight of the DI water, the viscosity of the fourth slurry composition may decrease so that the mechanical polishing rate may unfortunately decrease. Thus, the fourth slurry composition may preferably include about 70 to about 95 percent by weight of the DI water. For example, the fourth slurry composition more preferably includes about 72 to about 79 percent by weight of the DI water.

When a pH value of the fourth slurry composition is below about 10, the fourth slurry composition may be a relatively weak base or an acid. Thus, a chemical mechanical polishing rate may unfortunately decrease. When the pH value of the fourth slurry composition is above about 12, the fourth slurry composition may be a relatively strong base. Thus, a chemical mechanical polishing apparatus may be unfortunately damaged. As a result, the pH value of the fourth slurry composition may preferably be about 10 to about 12. For example, the pH value of the fourth slurry composition is more preferably about 10.2 to about 11.8.

The pH value of the fourth slurry composition varies with the amount of the pH control agent included in the fourth slurry composition. The pH control agent may be potassium hydroxide (KOH), sodium hydroxide (NaOH), ammonium hydroxide ($NH_4OH$), sulfuric acid ($H_2SO_4$), hydrochloric acid (HCl), or nitric acid ($HNO_3$). These may be used alone or in combination. In some embodiments, potassium hydroxide is used as the pH control agent.

When the pH control agent is below about 0.001 percent by weight, the pH value of the fourth slurry composition may not be easily controlled. When the pH control agent is over about 2 percent by weight, the pH control agent may unfortunately serve as an impurity reducing the polishing rate of the silicon oxide layer. Thus, the pH control agent may preferably be about 0.001 to 2 percent by weight. For example, the pH control agent may more preferably be about 0.001 to 1.1 percent by weight.

The fourth slurry composition may not include a surfactant attached to a silicon oxide layer to suppress a chemical removal of the silicon oxide layer. Thus, the silicon oxide layer may be chemically polished as well as mechanically. Although an area of the silicon oxide layer, the area contacting the polishing pad, becomes wide in virtue of a removal of the stepped portions formed at the upper portion of the silicon oxide layer, the silicon oxide layer may be chemically and mechanically polished. In other words, the self-stopping characteristic may not appear. In particular, since a chemically polished surface of the silicon oxide layer may not act dense, a mechanical polishing rate of the chemically polished surface of the silicon oxide layer may be relatively high.

Because the self-stopping characteristic may not appear when the silicon oxide layer is polished using the fourth slurry composition, a portion of the second layer 2200, the portion positioned between the preliminary polishing target face 4000 and the polishing target face 3000, is efficiently removed to form the third layer 2300.

Chemical Mechanical Polishing Method 3

A third chemical mechanical polishing method is substantially the same as the first chemical mechanical polishing method except that a second slurry composition is used instead of the first slurry composition. Thus, any repetitive explanation will be omitted.

The second slurry composition is substantially identical to the first slurry composition except for the pH value and the amount of the surfactant used.

The pH value of the second slurry composition is preferably about 5 to about 12. The second slurry composition preferably includes about 2 to 3 percent by weight of the surfactant.

Referring again to FIG. 6, the pH value of the second slurry composition is substantially higher than the isoelectric point of the silicon oxide layer. In other words, the pH value of the second slurry composition is substantially higher than about 5. Thus, the zeta potential may be negative. As a result, the surface of the silicon oxide layer may have a negative charge in the second slurry composition.

Because the surface of the silicon oxide layer has the negative charge, an electrical repulsive force may be generated between the surface of the silicon oxide layer and the anionic polymer dissociated from the surfactant. Thus, the anionic polymer may hardly attach to the surface of the silicon oxide layer because of the repulsive force. As a result, in general, a self-stopping characteristic may not appear.

However, when the second slurry composition includes about 2 to about 3 percent by weight of the surfactant, the self-stopping characteristic may appear. It is because the anionic polymer dissociated from the surfactant floats between the polishing pad and the silicon oxide layer and affects a fluidity of the third slurry composition. In other words, the silicon oxide layer may be protected by the anionic polymer although the electric repulsive force prevents the anionic polymer from being easily attached to the silicon oxide layer. Thus, the second slurry composition may preferably include about 2 to about 3 percent by weight of the surfactant.

That is, although the electric repulsive force prevents the anionic polymer from being easily attached to the silicon oxide layer, a chemical polishing rate of the silicon oxide layer may be reduced by increasing the amount of the surfactant.

The stepped portions formed at the upper portion of the silicon oxide layer may be mechanically polished with the aid of the polishing pad and the abrasive rather than chemically. After the stepped portions are removed, an upper face of the silicon oxide layer may be relatively flat. Thus, an area of the silicon oxide layer, the area contacting the polishing pad, may become relatively wide. As described above, because the anionic polymer dissociated from the surfactant floats between the polishing pad and the silicon oxide layer and affects the fluidity of the third slurry composition, the silicon oxide layer may not be chemically polished. Thus, the upper face of the silicon oxide layer may act physically dense. As a result, when the stepped portions are selectively removed, a mechanical polishing rate readily shrinks so that the silicon oxide layer may be hardly polished. That is, the self-stopping characteristic may not appear when the silicon oxide layer is polished using the second slurry composition.

The second slurry composition is substantially the same as the third slurry composition except for the amount of the surfactant used. Thus, the second slurry composition may be easily changed into the third slurry composition only by regulating the amount of the surfactant included in the second slurry composition.

As a result, a chemical mechanical polishing process sequentially using the second slurry composition and the third slurry composition may be performed in-situ only by regulating the amount of the surfactant.

Hereinafter, an experiment for evaluating a polishing rate of a silicon oxide layer of the second slurry composition will be described.

In Comparative Examples 1 to 6, conventional slurry compositions were used instead of the second slurry composition.

In Examples 1 and 2, the slurry compositions having surfactant amounts in a range of that of the second slurry composition were used.

Particularly, the slurry composition of Comparative Example 1 included about 1 percent by weight of ceria, 0.001 percent by weight of ammonium polycarboxylate, and about 96.3 percent by weight of the DI water. The pH value of the slurry composition of Comparative Example 1 was about 11. The slurry composition of Comparative Example 2 included about 1 percent by weight of ceria, about 0.2 percent by weight of ammonium polycarboxylate, and about 96.3 percent by weight of the DI water. The pH value of the slurry composition of Comparative Example 2 was about 11. The slurry composition of Comparative Example 3 included about 1 percent by weight of ceria, about 0.4 percent by weight of ammonium polycarboxylate, and about 96.3 percent by weight of the DI water. The pH value of the slurry composition of Comparative Example 3 was about 11. The slurry composition of Comparative Example 4 included about 1 percent by weight of ceria, about 0.6 percent by weight of ammonium polycarboxylate, and about 96.3 percent by weight of the DI water. The pH value of the slurry composition of Comparative Example 4 was about 11. The slurry composition of Comparative Example 5 included about 1 percent by weight of ceria, about 0.8 percent by weight of ammonium polycarboxylate, and about 96.3 percent by weight of the DI water. The pH value of the slurry composition of Comparative Example 5 was about 11. The slurry composition of Comparative Example 6 included about 1 percent by weight of ceria, about 1.2 percent by weight of ammonium polycarboxylate and about 96.3 percent by weight of the DI water. The pH value of the slurry composition of Comparative Example 6 was about 11.

The slurry composition of Example 1 included about 1 percent by weight of ceria, about 2 percent by weight of ammonium polycarboxylate and about 96.3 percent by weight of the DI water. The pH value of the slurry composition of Example 1 was about 11. The slurry composition of Example 2 included about 1 percent by weight of ceria, about 2.8 percent by weight of ammonium polycarboxylate and about 96.3 percent by weight of the DI water. The pH value of the slurry composition of Example 2 was about 11.

Chemical mechanical polishing processes were performed on blanket substrates. The blanket substrate had a silicon oxide layer including plasma-enhanced tetraethoxysilane (PE-TEOS) oxide. A thickness of the silicon oxide layer was about 10,000 Å.

A Mirra-OnTrak manufactured by Applied Materials, Inc. (AMAT) was employed as a chemical mechanical polishing apparatus. An IC1000 stack pad manufactured by Rodel, Inc. was employed as a polishing pad.

A flow rate of a slurry composition was about 200 mL/min. An inner tube force, a retain ring force and a membrane force were about 5.2 psi, about 6.0 psi, and about 5.2 psi, respectively. Rotational velocities of a polishing table and a polishing head were about 63 rpm and about 57 rpm, respectively.

Under the above-described conditions, the chemical mechanical polishing processes were performed on the silicon oxide layers respectively using the slurry compositions. Thereafter, removal rates of the oxide layers were measured.

Figure 7:
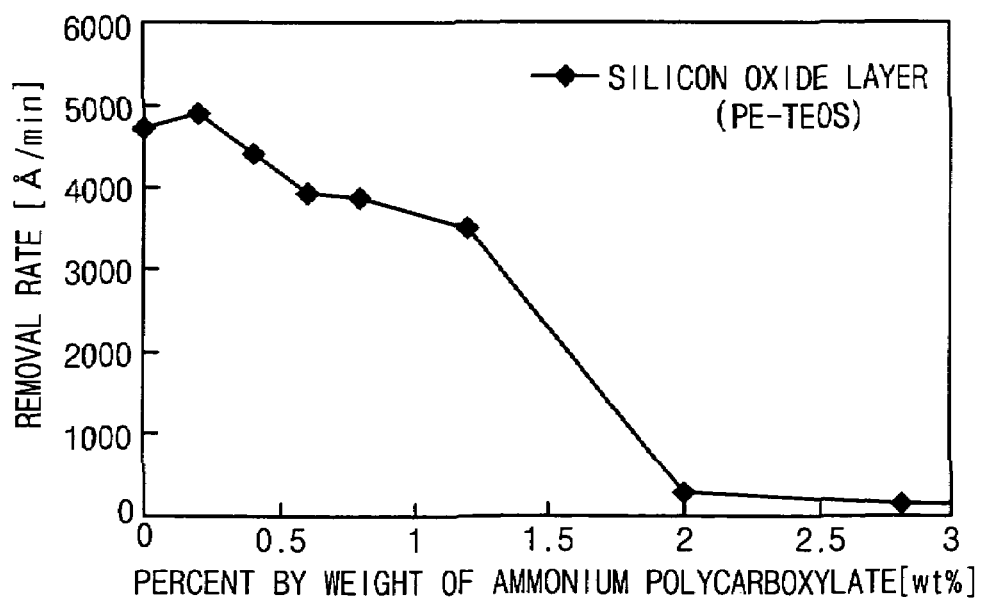
FIG. 7 is a graph illustrating a measurement result of an experiment for evaluating a polishing rate of a silicon oxide layer.

Measurement results are shown in Table 1. FIG. 7 is a graph illustrating the measurement results of the experiment for evaluating the polishing rate of the silicon oxide layer.

TABLE 1

| Slurry Composition | Percent by Weight of Ammonium Polycarboxylate | Removal Rate of Silicon Oxide Layer [Å/min] | pH |
|---|---|---|---|
| Comparative Example 1 | 0.001 | 4,712 | 11 |
| Comparative Example 2 | 0.2 | 4,868 | 11 |
| Comparative Example 3 | 0.4 | 4,390 | 11 |
| Comparative Example 4 | 0.6 | 3,940 | 11 |
| Comparative Example 5 | 0.8 | 3,886 | 11 |
| Comparative Example 6 | 1.2 | 3,526 | 11 |
| Example 1 | 2 | 310 | 11 |
| Example 2 | 3 | 100 | 11 |

Referring to FIG. 7, the removal rates of the silicon oxide layers in the slurry compositions of Comparative Examples 1 to 6, the slurry compositions including about 0.001 to about 1.2 percent by weight of ammonium polycarboxylate, are about 4,712, 4,868, 4,390, 3,940, 3,886 and 3,526 Å/min, respectively. An average of the removal rates of the silicon oxide layers with respect to the slurry compositions of Comparative Examples 1 to 6 is about 4,130 Å. That is, the average of the removal rates of the silicon oxide layers with respect to the slurry compositions of Comparative Examples 1 to 6 is relatively large. However, the removal rates of the silicon oxide layers with respect to the slurry compositions of Examples 1 and 2, the slurry compositions including about 7 to about 8 percent by weight of ammonium polycarboxylate, are about 310 Å/min and about 100 Å/min, respectively. An average of the removal rates of the silicon oxide layers with respect to the slurry compositions of Examples 1 and 2 is about 205 Å. That is, the average of the removal rates of the silicon oxide layers is relatively low.

Referring again to FIG. 6, an isoelectric point of the silicon oxide layer is about pH 5. The pH values of the slurry compositions of Comparative Examples 1 to 6 and Examples 1 and 2 are about 11. Thus, the pH values of the slurry compositions are substantially higher than the isoelectric point. As a result, the zeta potential may be negative. Because the zeta potential is negative, the surface of the silicon oxide layer may have a negative charge in the slurry compositions.

Since the surface of the silicon oxide layer has the negative charge, an electrical repulsive force may be generated between the surface of the silicon oxide layer and the anionic polymer dissociated from the surfactant. Thus, the anionic polymer may hardly protect the surface of the silicon oxide layer because of the repulsive force. Accordingly, in general, a self-stopping characteristic may not appear.

However, polish rates of the silicon oxide layer with respect to the slurry compositions of Examples 1 and 2 are relatively low. That is, the self-stopping characteristic may appear. This is because the slurry compositions of Examples 1 and 2 include a relatively large percent by weight of the surfactant so that anionic polymers dissociated from the surfactant float between the polishing pad and the silicon oxide layer and affect fluidities of the slurry compositions of Examples 1 and 2.

In other words, the silicon oxide layer may be protected by the anionic polymer although the electric repulsive force prevents the anionic polymer from being easily attached to the silicon oxide layer. Thus, a chemical removal of the silicon oxide layer may be suppressed by increasing the percent by weight of ammonium polycarboxylate.

Thus, if the chemical mechanical polishing process is performed using the slurry compositions of Examples 1 and 2, then the surface of the silicon oxide layer may be mechanically polished with the aid of the polishing pad and the abrasive rather than chemically. In particular, stepped portions formed at an upper portion of the silicon oxide layer may be mechanically polished first.

After the stepped portions are removed, an upper face of the silicon oxide layer may be relatively flat. Thus, an area of the silicon oxide layer, the area contacting the polishing pad, may become relatively wide. As a result, after the stepped portions are removed, a mechanical polishing rate rapidly shrinks so that the silicon oxide layer may be hardly polished. That is, a polishing process of the silicon oxide layer may stop by itself. In other words, a self-stopping characteristic appears.

Chemical Mechanical Polishing Method 4

A fourth chemical mechanical polishing method is substantially identical to the third chemical mechanical polishing method except that the fourth slurry composition is used instead of the third slurry composition.

The fourth slurry composition is already explained in the second chemical mechanical polishing method. Thus, any further explanation will be omitted.

Test of Polishing

Figure 8:
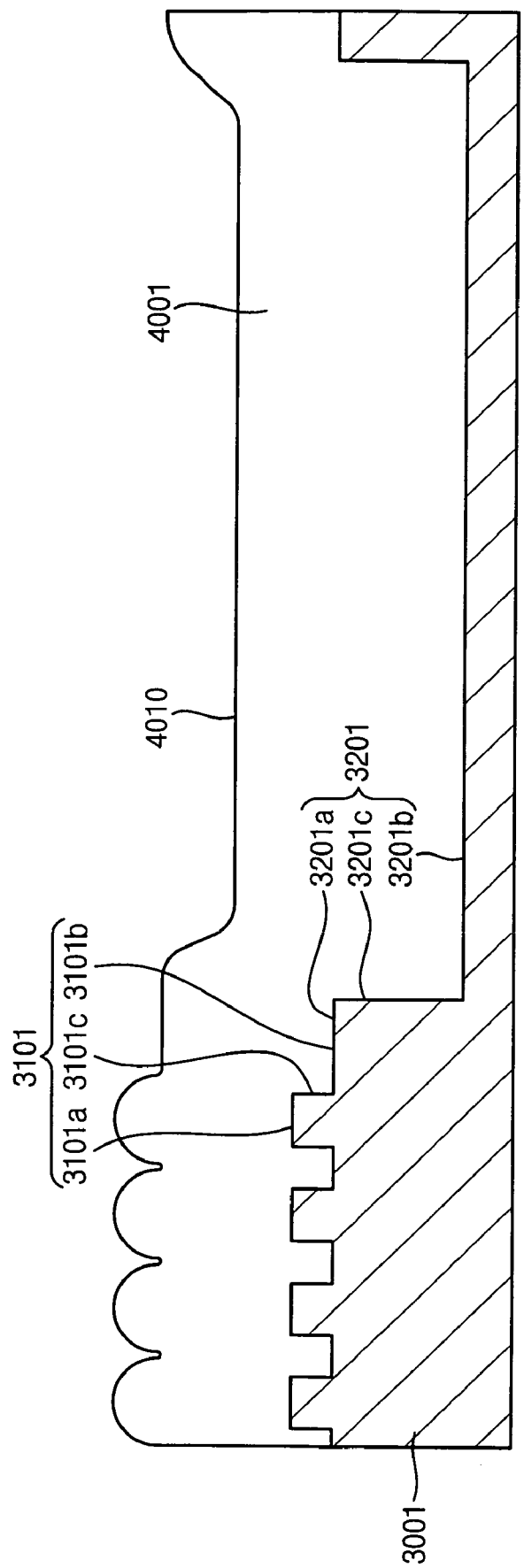
FIG. 8 is a cross-sectional view illustrating an example substrate.

FIG. 8 is a cross-sectional view illustrating an example substrate. The example substrate 10000 was manufactured in accordance with some embodiments of the present invention.

Referring to FIG. 8, the example substrate 10000 included a substrate 3001 and a silicon oxide layer 4001. The silicon oxide layer 4001 was formed on the substrate 3001. The silicon oxide layer 4001 included PE-TEOS oxide.

The substrate 3001 included a first stepped portion 3101 and a second stepped portion 3201. In detail, the first stepped portion 3101 included a first upper face 3101a, a first lower face 3101b positioned below the first upper face 3101a, and a first sidewall 3101c between the first upper face 3101a and the first lower face 3101b. The first upper face 3101a and the first lower face 3101b were substantially horizontal. In addition, the first upper face 3101a was substantially parallel with the first lower face 3101b. The first sidewall 3101c was substantially vertical. In addition, the first sidewall 3101c was substantially perpendicular to the first upper face 3101a and the first lower face 3101b. A polishing target face corresponded to the upper face 3101a of the first stepped portion 3101.

The second stepped portion 3201 included a second upper face 3201a, a second lower face 3201b positioned below the second upper face 3201a, and a second sidewall 3201c between the second upper face 3201a and the second lower face 3201b.

The first lower face 3101b of the first stepped portion 3101 and the second upper face 3201a of the second stepped portion 3201 were substantially coplanar. That is, the first lower face 3101b corresponded to the second upper face 3201a. Thus, the first stepped portion 3101 was connected to the second stepped portion 3201.

A width of the lower face 3201b of the second stepped portion 3201 was about $10^7$ Å. A portion 4010 of a surface of the silicon oxide layer 4001, the portion being positioned directly over the lower face 3201b of the second stepped portion 3201, was positioned above the polishing target face corresponding to the upper face 3101a of the first stepped portion 3101.

First and second test slurry compositions were prepared. The first test slurry composition had a self-stopping characteristic. On the other hand, the second test slurry composition did not have the self-stopping characteristic.

Particularly, the first test slurry composition included about 1 percent by weight of silica, about 1 percent by weight of ammonium polycarboxylate and about 96.3 percent by weight of DI water. A pH value of the first test slurry composition was about 4.5.

The second test slurry composition included about 12.5 percent by weight of silica, about 75.8 percent by weight of DI water, and about 1 percent by weight of potassium hydroxide. A pH value of the second test slurry composition was about 11.8.

A Mirra-OnTrak manufactured by Applied Materials, Inc. (AMAT) was employed as a chemical mechanical polishing apparatus. An IC1000 stack pad manufactured by Rodel, Inc. was employed as a polishing pad. The flow rate of the slurry compositions was about 200 mL/min. An inner tube force, a retain ring force and a membrane force were about 5.2 psi, about 6.0 psi, and about 5.2 psi, respectively. Rotational velocities of a polishing table and a polishing head were about 63 rpm and about 57 rpm, respectively.

The example substrate 10000 was polished to a preliminary polishing target face by using the first test slurry composition. The predetermined polishing target face was set up between the upper face 3101a of the first stepped portion 3101 and the portion 4010 of the surface of the silicon oxide layer 4001, the portion being positioned directly over the lower face 3201b of the second stepped portion 3201. Here, the upper face 3101a of the first stepped portion 3101 corresponded to the polishing target face.

Subsequently, the example substrate 10000 was polished from the preliminary polishing target face to the polishing target face by using the second test slurry composition.

Figure 9:
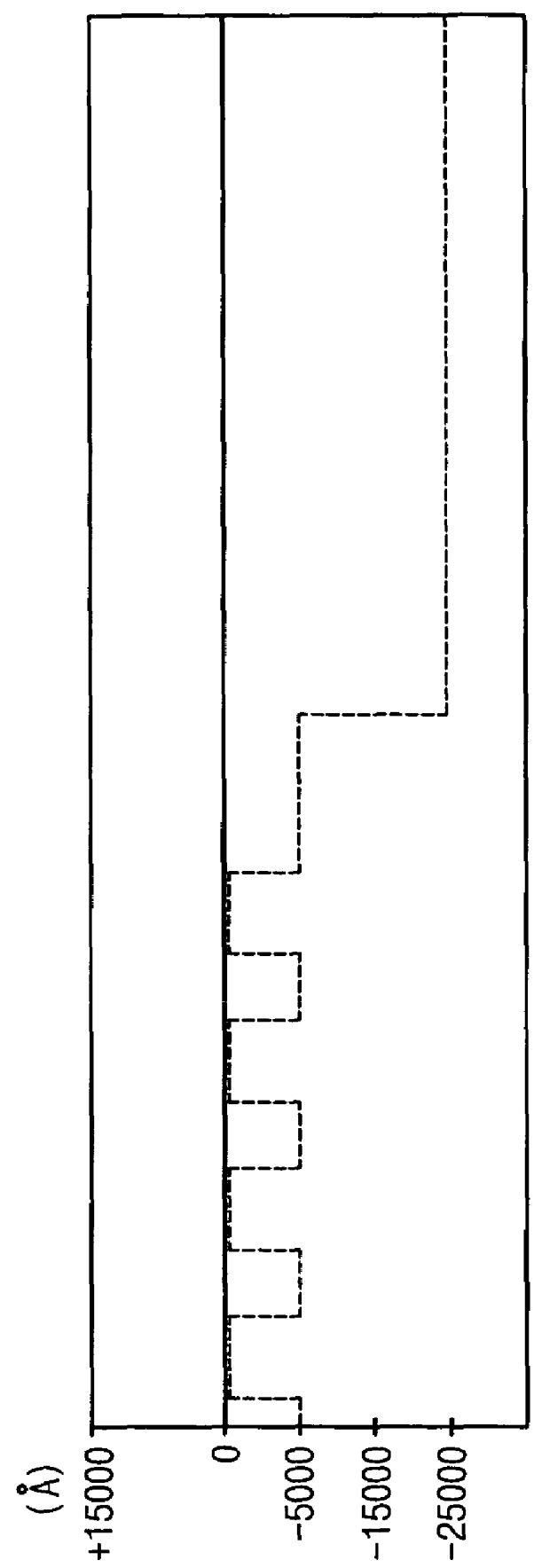
FIG. 9 is a graph illustrating a shape of the example substrate.

Thereafter, a shape of a surface of the example substrate 10000 was measured using a probe moving along the surface of the example substrate 10000. FIG. 9 is a graph illustrating the shape of the example substrate 10000.

Referring to FIG. 9, a solid line indicates the surface of the example substrate 10000. A dotted line indicates a shape of the substrate 3001. Because the solid line is relatively straight, the surface of the example substrate 10000 may be relatively flat. In addition, while the surface of the example substrate 10000 is relatively flat, the substrate 3001 may be hardly damaged by the chemical mechanical polishing process.

Figure 10:
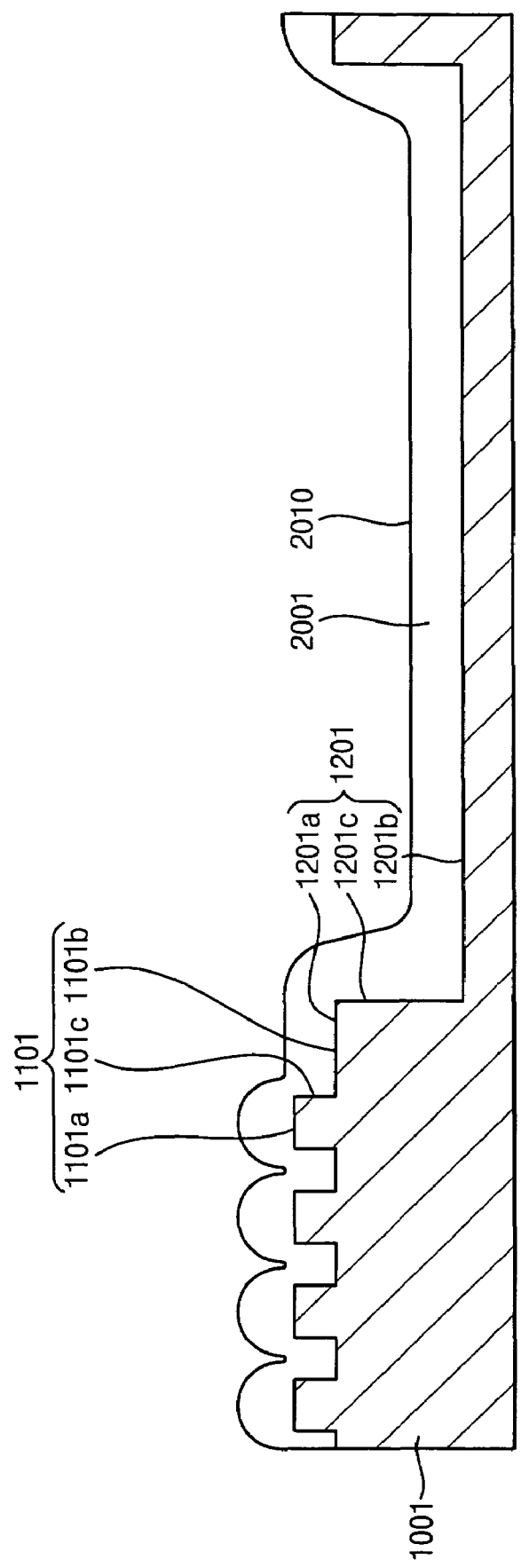
FIG. 10 is a cross-sectional view illustrating a comparative example substrate.

FIG. 10 is a cross-sectional view illustrating a comparative example substrate. The comparative example substrate 20000 was manufactured by a conventional method.

Referring to FIG. 10, the comparative example substrate 20000 included a substrate 1001 and a silicon oxide layer 2001. The silicon oxide layer 2001 was formed on the substrate 1001. The silicon oxide layer 2001 included PE-TEOS oxide.

The substrate 1001 included a first stepped portion 1101 and a second stepped portion 1201. In detail, the first stepped portion 1101 included a first upper face 1101a, a first lower face 1101b positioned below the first upper face 1101a and a first sidewall 1101c between the first upper face 1101a and the first lower face 1101b. The first upper face 1101a and the first lower face 1101b were substantially horizontal. In addition, the first upper face 1101a was substantially parallel with the first lower face 1101b. The first sidewall 1101c was substantially vertical. In addition, the first sidewall 1101c was substantially perpendicular to the first upper face 1101a and the first lower face 1101b. A polishing target face corresponded to the upper face 1101a of the first stepped portion 1101.

The second stepped portion 1201 included a second upper face 1201a, a second lower face 1201b positioned below the second upper face 1201a, and a second sidewall 1201c between the second upper face 1201a and the second lower face 1201b.

The first lower face 1101b of the first stepped portion 1101 and the second upper face 1201a of the second stepped portion 1201 were substantially coplanar. That is, the first lower face 1101b corresponded to the second upper face 1201a. Thus, the first stepped portion 1101 was connected to the second stepped portion 1201.

A width of the lower face 1201b of the second stepped portion 1201 was about $10^7$ Å. A portion 2010 of a surface of the silicon oxide layer 2001, the portion being positioned directly over the lower face 1201b of the second stepped portion 1201, was positioned below the polishing target face corresponding to the upper face 1101a of the first stepped portion 1101.

The first test slurry composition was prepared. As described above, the first test slurry composition included about 1 percent by weight of silica, about 1 percent by weight of ammonium polycarboxylate, and about 96.3 percent by weight of DI water. A pH value of the first test slurry composition was about 4.5.

A process apparatus and process conditions were substantially identical to those employed when the example substrate 10000 was polished.

The comparative example substrate 20000 was polished to the polishing target face by using the first test slurry composition. That is, the comparative example substrate 20000 was polished to the upper face 1101a of the first stepped portion 1101 by using the first test slurry composition.

Figure 11:
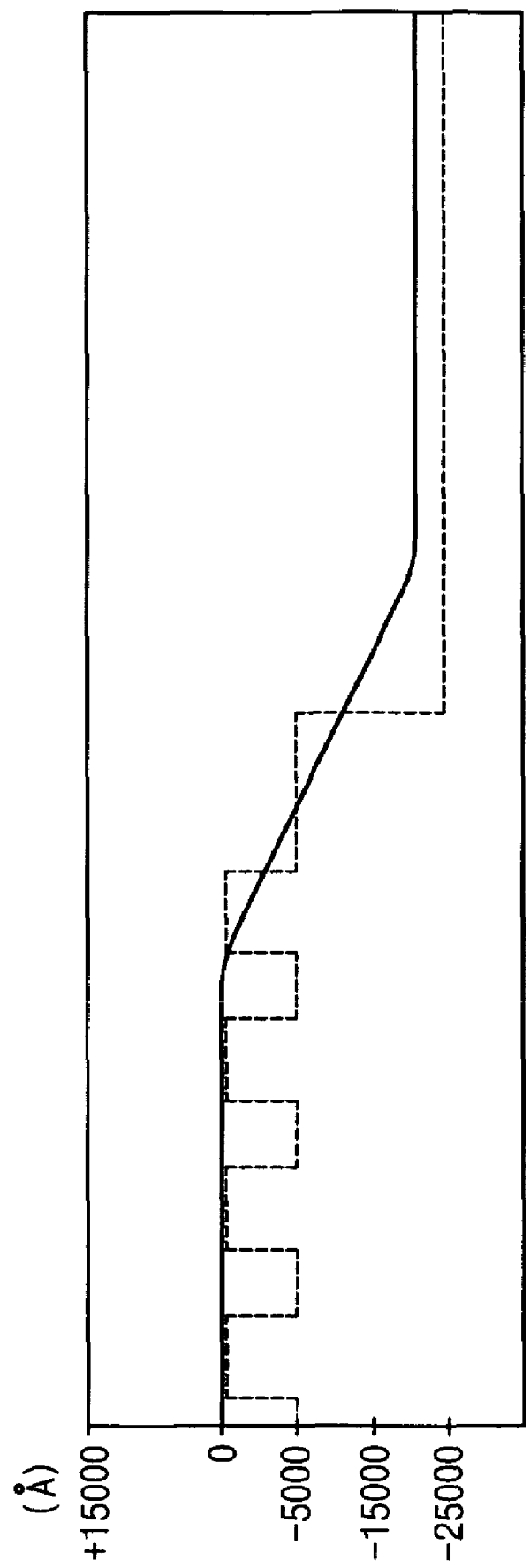
FIG. 11 is a graph illustrating a shape of the comparative example substrate.

Thereafter, a shape of a surface of the comparative example substrate 20000 was measured using the probe moving along the surface of the comparative example substrate 20000. FIG. 11 is a graph illustrating the shape of the comparative example substrate 20000.

Referring to FIG. 11, a dotted line indicates a shape of the substrate 1001. A solid line indicates the shape of the comparative example substrate 20000, measured after the comparative example substrate is polished. Damage may be generated at a portion where the solid line is positioned below the dotted line.

Thus, the comparative example substrate 20000 polished using the first test composition may be damaged more than the example substrate 10000 polished sequentially using the first test slurry composition and the second test slurry composition.

According to the present invention, an upper face of a layer formed on a substrate may be positioned above a polishing target face. In addition, the layer is polished sequentially using a first slurry composition that has a self-stopping characteristic and a second slurry composition that does not have the self-stopping characteristic. Thus, the layer may be efficiently planarized. In addition, the substrate may be minimally damaged.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of chemical mechanical polishing a substrate of a type comprising:
    a first stepped portion having a first upper face, a first lower face positioned below the first upper face, and a first sidewall between the first upper face and the first lower face; and
    a first layer on the substrate, the first layer including a stepped portion, the stepped portion formed over the first stepped portion, the stepped portion substantially conforming to the first stepped portion, the first upper face of the first stepped portion positioned below the first layer, the method comprising:
        performing a first polishing process on the stepped portion of the first layer using a slurry composition including a surfactant having an anionic polymer to change the first layer into a second layer having a substantially flat surface, the second layer covering the first upper face, the slurry composition having a pH value at which a zeta potential of the first layer is positive; and
        performing a second polishing process on the second layer until the first upper face of the first stepped portion is exposed.

2. The method of claim 1, wherein the first layer includes an oxide.

3. The method of claim 2, wherein the oxide includes at least one material selected from the group consisting of BPSG, PSG, USG, and SOG.

4. The method of claim 2, wherein the first layer is formed by a plasma-enhanced chemical vapor deposition (PE-CVD) process.

5. The method of claim 2, wherein the first layer is formed by a high-density plasma chemical vapor deposition (HDP-CVD) process.

6. The method of claim 1, wherein the surfactant includes at least one material selected from the group consisting of polycarboxylic acid, polyethylenimine, polyvinyl sulfonic acid, polyvinyl sulfonic acid salt, polyethylenimine salt, polyvinyl sulfonic acid salt, and ammonium polycarboxylate.

7. The method of claim 1, wherein the second polishing process is performed using a slurry composition comprising about 0.001 to about 2 percent by weight of a surfactant including an anionic polymer, the slurry composition having a pH value at which a zeta potential of the second layer is negative.

8. The method of claim 7, wherein the surfactant includes at least one material selected from the group consisting of polycarboxylic acid, polyethylenimine, polyvinyl sulfonic acid, polyvinyl sulfonic acid salt, polyethylenimine salt, polyvinyl sulfonic acid salt, and ammonium polycarboxylate.

9. The method of claim 1, wherein the second polishing process is performed using a slurry composition including about 3 to about 28 percent by weight of an abrasive, about 70 to about 95 percent by weight of DI water, and about 0.001 to about 2 percent by weight of a pH control agent.

10. The method of claim 9, wherein the abrasive includes at least one material selected from the group consisting of silica, ceria, alumina, titania, zirconia, and germania.

11. The method of claim 9, wherein the pH control agent includes at least one material selected from the group consisting of potassium hydroxide, sodium hydroxide, ammonium hydroxide, sulfuric acid, hydrochloric acid, and nitric acid.

12. A method of chemical mechanical polishing a substrate of a type comprising:

a first stepped portion having an upper face, a middle face positioned below the upper face, a lower face positioned below the middle face, an upper sidewall between the upper face and the middle face and a lower sidewall between the middle face and the lower face; and a first layer on the substrate having a surface above the upper face of the first stepped portion, the first layer having a stepped portion substantially conforming to the first stepped portion, the method comprising:

performing a first polishing process on the stepped portion of the first layer using a slurry composition comprising a surfactant including an anionic polymer to change the first layer into a second layer having a substantially flat surface, the second layer covering the upper face of the first stepped portion, the slurry composition having a pH value at which a zeta potential of the first layer is positive; and performing a second polishing process on the second layer until the upper face of the first stepped portion is exposed.

13. The method of claim 12, wherein the first layer includes an oxide.

14. The method of claim 13, wherein the oxide includes at least one material selected from the group consisting of BPSG, PSG, USG, and SOG.

15. The method of claim 13, wherein the first layer is formed by a plasma-enhanced chemical vapor deposition (PE-CVD) process.

16. The method of claim 13, wherein the first layer is formed by a high-density plasma chemical vapor deposition (HDP-CVD) process.

17. The method of claim 12, wherein the surfactant includes at least one material selected from the group consisting of polycarboxylic acid, polyethylenimine, polyvinyl sulfonic acid, polyvinyl sulfonic acid salt, polyethylenimine salt, polyvinyl sulfonic acid salt, and ammonium polycarboxylate.

18. The method of claim 12, wherein the second polishing process is performed using a slurry composition comprising about 0.001 to about 2 percent by weight of a surfactant including an anionic polymer, the slurry composition having a pH value at which a zeta potential of the second layer is negative.

19. The method of claim 18, wherein the surfactant includes at least one material selected from the group consisting of polycarboxylic acid, polyethylenimine, polyvinyl sulfonic acid, polyvinyl sulfonic acid salt, polyethylenimine salt, polyvinyl sulfonic acid salt, and ammonium polycarboxylate.

20. The method of claim 12, wherein the second polishing process is performed using a slurry composition including about 3 to about 28 percent by weight of an abrasive, about 70 to about 95 percent by weight of DI water, and about 0.001 to about 2 percent by weight of a pH control agent.

21. The method of claim 20, wherein the abrasive includes at least one selected from the group consisting of silica, ceria, alumina, titania, zirconia, and germania.

22. The method of claim 20, wherein the pH control agent includes at least one material selected from the group consisting of potassium hydroxide, sodium hydroxide, ammonium hydroxide, sulfuric acid, hydrochloric acid, and nitric acid.

23. A method of chemical mechanical polishing a substrate of a type comprising:

a first stepped portion having an upper face; and a first layer on the substrate, the first layer including a stepped portion, the stepped portion formed over, and substantially conforming to, the first stepped portion, the method comprising:

performing a first polishing process on the stepped portion of the first layer using a slurry composition comprising a surfactant including an anionic polymer to change the first layer into a second layer having a substantially flat surface, the second layer covering the upper face of the first stepped portion, the slurry composition having a pH value at which a zeta potential of the first layer is positive; and performing a second polishing process on the second layer until the upper face of the first stepped portion is exposed.

24. A method of chemical mechanical polishing a substrate of a type comprising:

a first stepped portion having a first upper face, a first lower face positioned below the first upper face, and a first sidewall between the first upper face and the first lower face and a second stepped portion having a second upper face, a second lower face positioned below the second upper face, and a second sidewall between the second upper face and the second lower face, the first lower face corresponding to the second upper face; and a first layer on the substrate, the first layer including a stepped portion, the stepped portion formed over the first stepped portion and the second stepped portion, the stepped portion substantially conforming to the first stepped portion and the second stepped portion, the first upper face of the first stepped portion positioned below the first layer, the method comprising:

performing a first polishing process on the stepped portion of the first layer using a slurry composition including a surfactant having an anionic polymer to change the first layer into a second layer having a substantially flat surface, the second layer covering the first upper face of the first stepped portion, the slurry composition having a pH value at which a zeta potential of the first layer is positive; and performing a second polishing process on the second layer until the first upper face of the first stepped portion is exposed.

* * * * *